US007835564B2

(12) United States Patent
Bearup et al.

(10) Patent No.: US 7,835,564 B2
(45) Date of Patent: Nov. 16, 2010

(54) NON-DESTRUCTIVE, BELOW-SURFACE DEFECT RENDERING USING IMAGE INTENSITY ANALYSIS

(75) Inventors: Delia R. Bearup, Petersburgh, NY (US); Andrew S. Dalton, New Milford, CT (US); James J. Demarest, Fishkill, NY (US); Loren L. Hahn, Poughquag, NY (US); Bruce J. Redder, Milton, NY (US); Francis R. Wallingford, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 869 days.

(21) Appl. No.: 11/742,095

(22) Filed: Apr. 30, 2007

(65) Prior Publication Data

US 2008/0270081 A1 Oct. 30, 2008

(51) Int. Cl.
 G06K 9/00 (2006.01)
 G01N 21/00 (2006.01)
 G01N 23/00 (2006.01)
 H04N 7/18 (2006.01)
 G03C 1/46 (2006.01)
(52) U.S. Cl. .................. 382/141; 382/147; 382/149; 356/237.2; 348/126; 430/506; 250/306; 250/310; 250/311
(58) Field of Classification Search .......... 382/100, 382/141, 145, 181, 190, 195, 205, 148, 172, 382/168, 152, 149, 147; 356/237.1, 237.2, 356/601, 613; 430/504, 903, 111.41, 505, 430/957, 544, 359, 212, 523, 904, 122.51, 430/506, 84, 379, 567; 348/126, 128, 616; 250/306, 310, 311, 559.42; 702/189
See application file for complete search history.

(56) References Cited

U.S. PATENT DOCUMENTS 5,808,735 A * 9/1998 Lee et al. .................. 356/237.2

(Continued)

FOREIGN PATENT DOCUMENTS

JP 2001325595 11/2001

OTHER PUBLICATIONS

Demarest et al., "Image Intensity Analysis for Defect Localization Utilizing SEM BSE Imaging," Proceedings of the 32nd International Symposium for Testing and Failure Analysis, ASM International, Austin, Texas, Nov. 12-16, 2006, pp. 288-292.

(Continued)

*Primary Examiner*—Sheela C Chawan
(74) *Attorney, Agent, or Firm*—Katherine Brown; Hoffman Warnick LLC

(57) ABSTRACT

Non-destructive, below-surface defect rendering of an IC chip using image intensity analysis is disclosed. One method includes providing an IC chip delayered to a selected layer; determining a defect location below a surface of the selected layer using a first image of the IC chip obtained using an CPIT in a first mode; generating a second image of the IC chip with the CPIT in a second mode, the second image representing charged particle signal from the defect below the surface of the selected layer; and rendering the defect by comparing an image intensity of a reference portion of the second image not including the defect with the image intensity of a defective portion of the second image including the defect, wherein the reference portion and the defective portion are of structures expected to be substantially identical.

20 Claims, 9 Drawing Sheets

U.S. PATENT DOCUMENTS

| | | | |
|---|---|---|---|
| 6,366,688 B1 | 4/2002 | Jun et al. | |
| 6,426,501 B1 * | 7/2002 | Nakagawa | 850/5 |
| 6,487,511 B1 * | 11/2002 | Wooten | 702/84 |
| 6,535,621 B1 | 3/2003 | Fujita | |
| 6,566,897 B2 * | 5/2003 | Lo et al. | 324/751 |
| 6,751,519 B1 * | 6/2004 | Satya et al. | 700/121 |
| 6,828,554 B2 * | 12/2004 | Hiroi et al. | 850/10 |
| 6,847,907 B1 * | 1/2005 | Novotny | 702/84 |
| 6,870,950 B2 | 3/2005 | Houge et al. | |
| 7,397,596 B2 * | 7/2008 | Yacoubian | 359/290 |
| 2006/0243908 A1 | 11/2006 | Shinada et al. | |

OTHER PUBLICATIONS

Gignac et al., "Imaging and analysis of subsurface Cu interconnects by detecting backscattered electrons in the scanning electron microscope," Journal of Applied Physics, vol. 97, Issue 114506, Jun. 1, 2005, pp. 1-9.

Demarest et al., "Low-k Time Dependent Dielectric Breakdown Failure Analysis Utilizing SEM Image Comparison for Defect Isolation," Proceedings of the 30th International Symposium for Testing and Failure Analysis, Worcester, Massachusetts, Nov. 14-18, 2004, pp. 425-428.

Unknown, "Monitoring Defects by Scanning Electron Microscope Beam Charging," IBM Technical Disclosure Bulletin, Bentson, LR, Burlington, Nov. 1988, pp. 476-477.

* cited by examiner

NON-DESTRUCTIVE, BELOW-SURFACE DEFECT RENDERING USING IMAGE INTENSITY ANALYSIS

BACKGROUND

1. Technical Field

The disclosure relates generally to integrated circuit (IC) chip fabrication, and more particularly, to non-destructive, below-surface defect rendering of an IC chip using image intensity analysis.

2. Background Art

Given the existing trends within the semiconductor industry, today's Integrated circuit (IC) chips continually shrink in dimension and increase in complexity. Current state-of-the-art IC chip technology can have upwards of 10 metal levels and multiple dielectric materials. This evolutionary process, however, allows for new opportunities for failure analysis as the very nature and construction of the hardware changes.

One opportunity, as disclosed by Gignac et al. includes detecting sub-surface defects using a transmission electron microscope (TEM) with a scanning attachment by collecting backscattered electrons (BSE) with an accelerating voltage on the order of 30-400 keV. This approach of using a high beam energy makes changes in intensity in the patterned copper metal easily recognizable by the human eye, but requires custom built analytical equipment, Another process, such as disclosed in U.S. Pat. No. 6,366,688 to Jun et al., uses a scanning electron microscope (SEM) to evaluate a surface of an IC chip. This approach, however, is limited to evaluation of a surface, and does not address sub-surface defects.

SUMMARY

Non-destructive, below-surface defect rendering of an IC chip using image intensity analysis is disclosed. One method includes providing an IC chip delayered to a selected layer; determining a defect location below a surface of the selected layer using a first image of the IC chip obtained using a charged particle imaging tool (CPIT) (where CPIT could be, but is not limited to, a scanning electron microscope (SE M), a transmission electron microscope (TEM), or a focused ion beam (FIB)) in a first mode; generating a second image of the IC chip with the CPIT in a second mode, the second image representing charged particle signal from the defect below the surface of the selected layer; and rendering the defect by comparing an image intensity of a reference portion of the second image not including the defect with the image intensity of a defective portion of the second image including the defect, wherein the reference portion and the defective portion are of structures expected to be substantially identical.

A first aspect of the disclosure provides a method comprising: providing an integrated circuit (IC) chip delayered to a selected layer; determining a defect location below a surface of the selected layer using a first image of the IC chip obtained using a charged particle imaging tool (CPIT) in a first mode; generating a second image of the IC chip with the CPIT in a second mode, the second image representing charged particle signal from the defect below the surface of the selected layer; and rendering the defect by comparing an image intensity of a reference portion of the second image not including the defect with the image intensity of a defective portion of the second image including the defect, wherein the reference portion and the defective portion are of structures expected to be substantially identical.

A second aspect of the disclosure provides a system comprising: means for determining a defect location below a surface of a selected, exposed layer of an integrated circuit (IC) chip using a first image of the IC chip obtained using a charged particle imaging tool (CPIT) in a first mode; means for generating a second image of the IC chip with the CPIT in a second mode, the second image representing charged particle signal from the defect below the surface of the selected layer; and means for rendering the defect by comparing an image intensity of a reference portion of the second image not including the defect with the image intensity of a defective portion of the second image including the defect, wherein the reference portion and the defective portion are of structures expected to be substantially identical.

A third aspect of the disclosure provides a program product stored on a computer-readable medium including program code, which when executed by a computer, performs the following processes: determining a defect location below a surface of a selected, exposed layer of an integrated circuit (IC) chip using a first image of the IC chip obtained using a charged particle imaging tool (CPIT) in a first mode; generating a second image of the IC chip with the CPIT in a second mode, the second image representing charged particle signal from the defect below the surface of the selected layer; and rendering the defect by comparing an image intensity of a reference portion of the second image not including the defect with the image intensity of a defective portion of the second image including the defect, wherein the reference portion and the defective portion are of structures expected to be substantially identical.

A fourth aspect of the disclosure provides a computer-readable medium that includes computer program code to enable a computer infrastructure to perform non-destructive, below-surface defect rendering of an IC chip using image intensity analysis, the computer-readable medium comprising computer program code for performing the method steps of the disclosure.

A fifth aspect of the disclosure provides a business method for performing non-destructive, below-surface defect rendering of an IC chip using image intensity analysis, the business method comprising managing a computer infrastructure that performs each of the steps of the disclosure; and receiving payment based on the managing step.

A sixth aspect of the disclosure provides a method of generating a system for perform nondestructive below-surface defect rendering of an IC chip using image intensity analysis, the method comprising: obtaining a computer infrastructure; and deploying means for performing each of the steps of the disclosure to the computer infrastructure.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
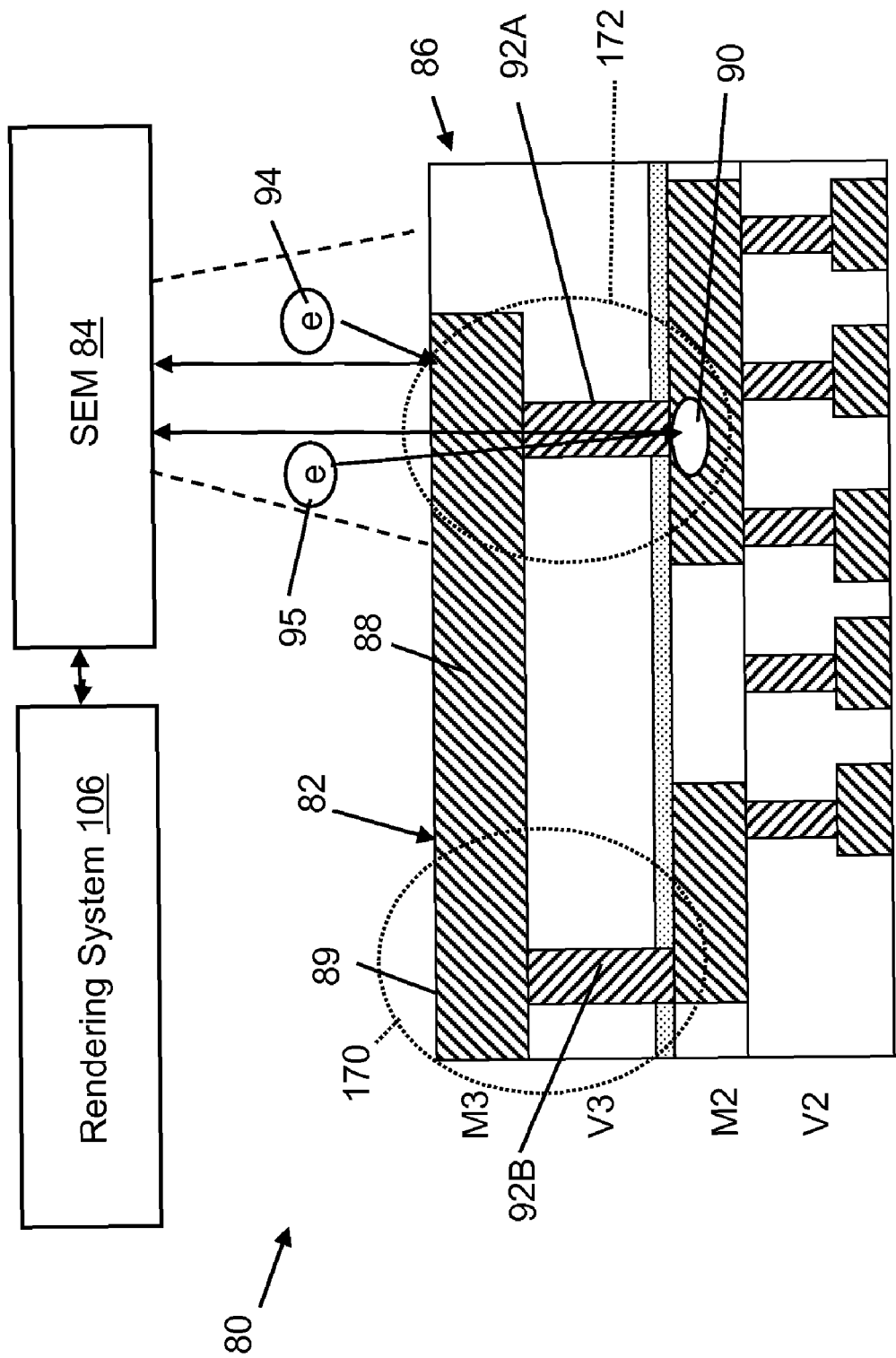
FIG. 1 shows an illustrative environment for imaging of an integrated circuit (IC) chip according to the disclosure.
Figure 2:
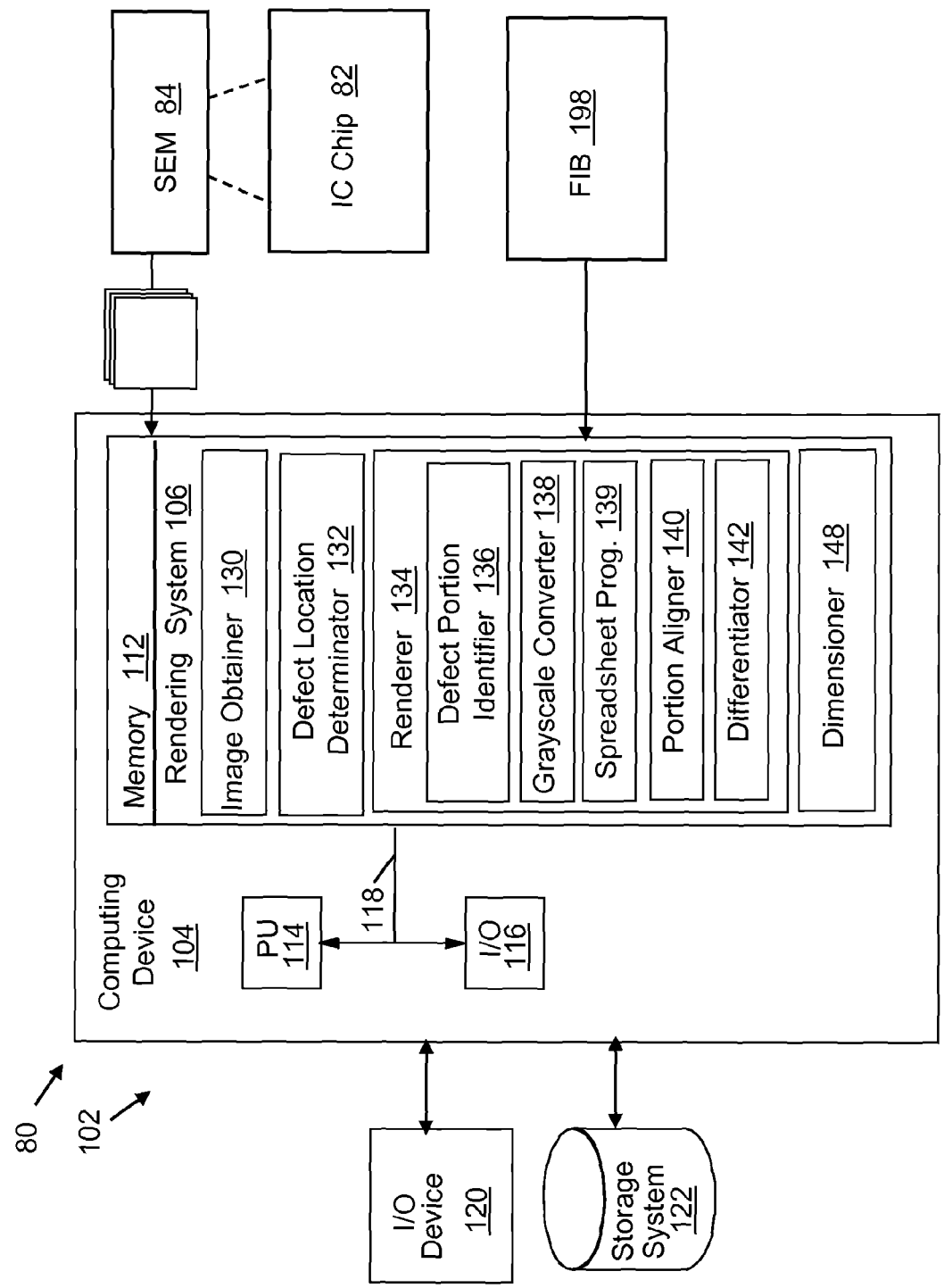
FIG. 2 shows the environment of FIG. 1 with a block diagram of one embodiment of an evaluation system according to the disclosure.

Turning to the drawings, FIGS. 1-2 show an illustrative environment 80 for non-destructive, below-surface defect rendering of an IC chip 82 using image intensity analysis provided by a rendering system 106. "Image intensity" indicates a brightness of pixel(s) of an image. As shown in FIG. 1, IC chip 82 is provided delayered to a selected layer 86, e.g., metal layer M3, that is exposed using any now known or later developed delayering technique. Selected layer 86 may include any layer of IC chip 82, and includes a structure 88 having an exposed surface 89 through which evaluation will occur. Structure 88 may include any element of a now known or later developed IC chip 88, e.g., a metal wire, a contact, a resistor, etc. below which a defect 90 may exist. In the example shown, structure 88 includes two vias 92A, 928 in via layer V3 that couple metal layer M3 and metal layer M2. FIG. 1 shows defect 90 as a void at a bottom of via 92A. However, defect 90 may take other forms and be located anywhere below surface 89. The disclosure is not limited in any way to this particular structure 88 and/or type and location of defect 90.

Figure 4:
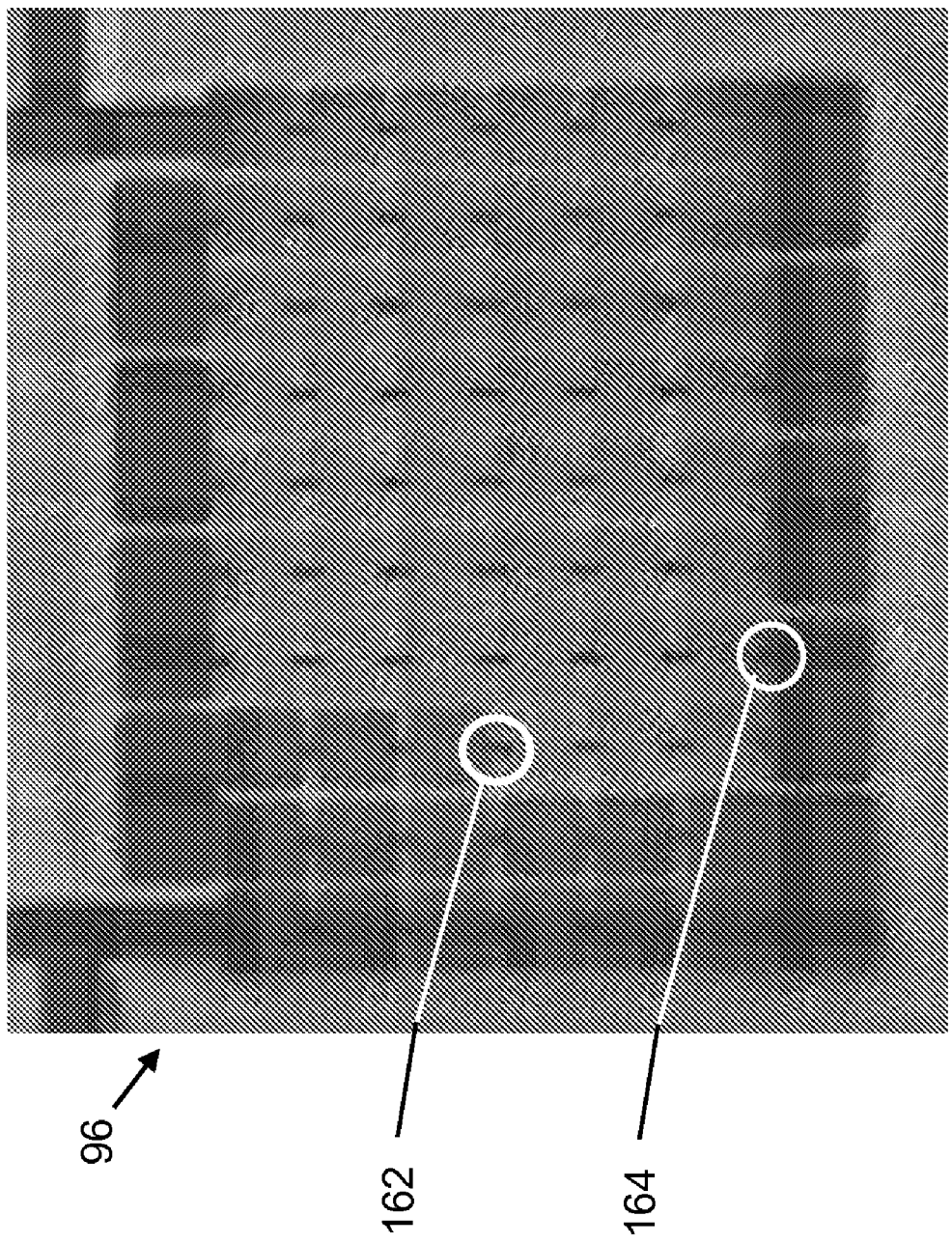
FIG. 4 shows one example of a first image generated by a charged particle imaging tool (CPIT) for the evaluation system of FIG. 2.
Figure 5:
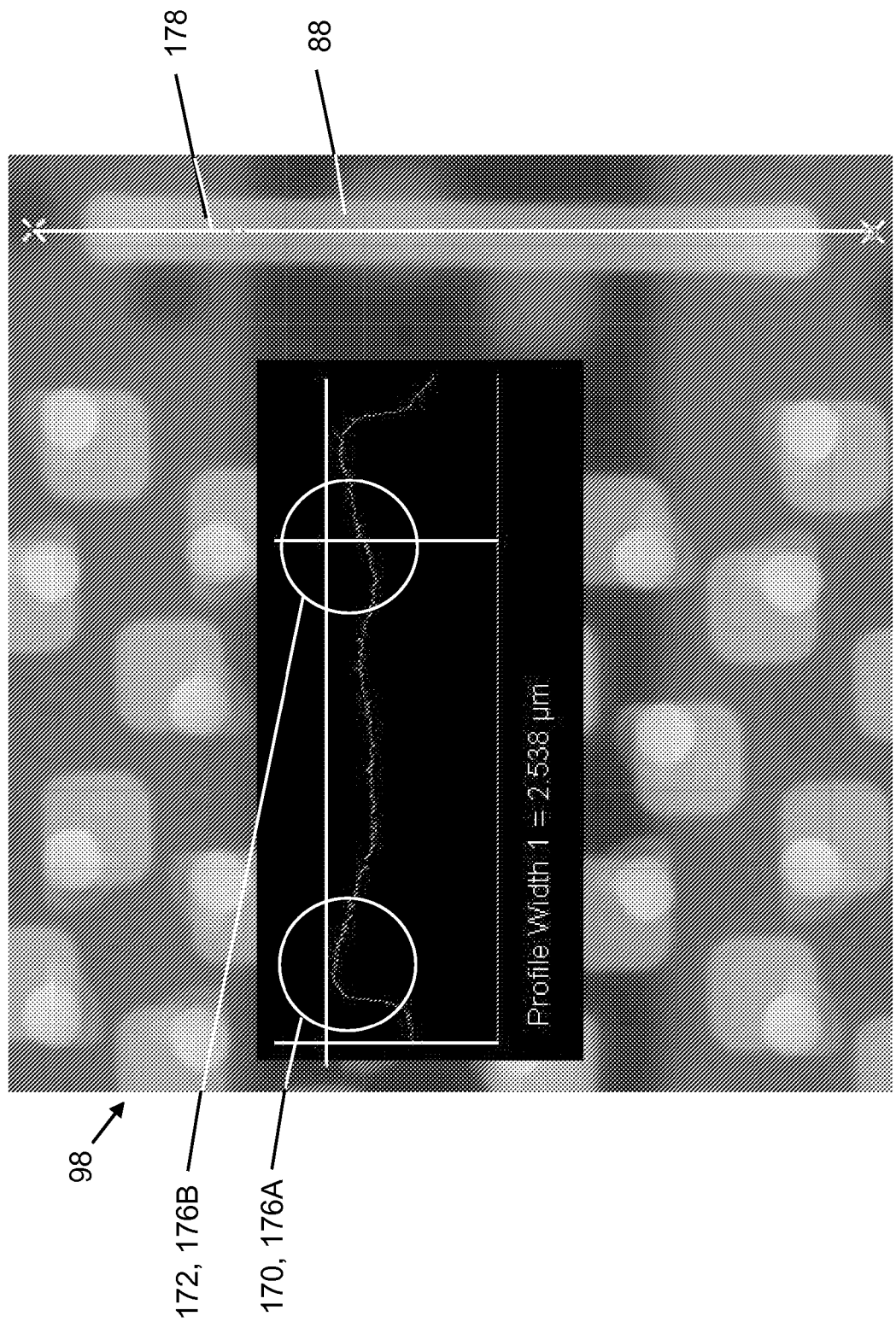
FIG. 5 shows one example of a second image including intensity profiles generated by the CPIT for the evaluation system of FIG. 2.

A charged particle imaging tool (CPIT) 84 images IC chip 82 and rendering system 106 performs the non-destructive, below-surface defect rendering of IC chip 82 using image intensity analysis according to the processes described herein. CPIT 84 may include any now known or later developed charged particle microscope capable of detecting charged particles (e.g., a scanning electron microscope, a transmission electron microscope, a focused ion beam, etc.). CPIT 84 is also capable of imaging in a secondary electron (first) mode and a backscatter (second) mode operation, or can achieve images similar to those created in those modes as they may be applied to electron microscopes. As shown in FIG. 1, CPIT 84 transmits charged particles 94, 95 (e.g., electrons, ions, etc.) that penetrate surface 89 of IC chip 82 to an extent that depends on the accelerating voltage used. Based on the material and the characteristics of the material, charged particles 94, 95 are reflected back out and detected by CPIT 84 and an image of IC chip 82 can be generated, e.g., as shown in FIGS. 4-5, as will be described in greater detail herein. A "secondary electron mode" typically means imaging using accelerating voltages only sufficient to image surface 89 of IC chip 82 such as typically used for voltage contrast inspection. In this mode, accelerating voltages may range from approximately 1 kV to approximately 3 kV although they can be as high as 5 kV to 10 kV, and charged particles 94 only penetrate to a relatively minor degree into surface 89. As shown in FIG. 4, an image 96 obtained in this mode reveals structures that are at a different potential with a higher pixel intensity (brighter) than structures that are at another potential such that defects 90, e.g., shorts or voids, can be readily detected by reviewing the image. In contrast, a "backscatter mode" typically means imaging using accelerating voltages higher than that in the secondary electron mode, which results in deeper penetration of charged particles 95 beyond surface 89 to depths at which subsurface defects 90 exist, and more atomic number contrast in the resulting image 98 (FIG. 5) than just surface imaging (FIG. 4). Accelerating voltages may range from approximately 15 kV to approximately 30 kV in a backscatter mode, where 'approximately' may be +/−1.0 kV. It is understood, however, that a higher accelerating voltage for the backscatter mode may not be necessary. Further details of images 96, 98 will be described herein.

FIG. 2 shows environment 80 including a block diagram of one embodiment of rendering system 106 for use with CPIT 84. Environment 80 may further include a computer infrastructure 102 that can perform the various process steps described herein for nondestructive, below-surface defect rendering of IC chip 82 using image intensity analysis. In particular, computer infrastructure 102 is shown including a computing device 104 that comprises rendering system 106, which enables computing device 104 to perform the processes of the disclosure.

Computing device 104 is shown including a memory 112, a processor (PU) 114; an input/output (I/O) interface 116, and a bus 118. Further, computing device 104 is shown in communication with an external I/O device/resource 120 and a storage system 122. As is known in the art, in general, processor 114 executes computer program code, such as rendering system 106, that is stored in memory 112 and/or storage system 122. While executing computer program code, processor 114 can read and/or write data, such as IC chip 82 image data, to/from memory 112 storage system 122 and/or I/O interface 116. Bus 118 provides a communications link between each of the components in computing device 104. I/O device 116 can comprise any device that enables a user to interact with computing device 104 or any device that enables computing device 104 to communicate with one or more other computing devices. Input/output devices (including but not limited to keyboards, displays, pointing devices, etc.) can be coupled to the system either directly or through intervening I/O controllers.

In any event, computing device 104 can comprise any specific or general purpose computing article of manufacture capable of executing computer program code installed by a user (e.g., a personal computer, server, handheld device, etc.). However, it is understood that computing device 104 and rendering system 106 are only representative of various possible equivalent computing devices that may perform the various process steps of the disclosure. To this extent in other embodiments, computing device 104 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 102 is only illustrative of various types of computer infrastructures for implementing the disclosure. For examples in one embodiment, computer infrastructure 102 comprises two or more computing devices (e.g., a server cluster) that communicate over any type of wired and/or wireless communications link, such as a network, a shared memory, or the like, to perform the various process steps of the disclosure. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques.

As previously mentioned and discussed further below, rendering system 106 along with CPIT 84 enables computing infrastructure 102 to perform non-destructive, below-surface defect rendering of IC chip 82 using image intensity analysis. To this extent, rendering system 106 is shown including a CPIT image obtainer 130 (which could include another instrument for obtaining an image); a defect location determinator 132; a renderer 134 including a defect portion identifier 136, a grayscale determinator 138, a data analyzer 139, a portion aligner 140 and a differentiator 142; and a dimensioner 148. Operation of each of these systems is discussed further herein. However, it is understood that some of the various systems shown in FIG. 2 can be implemented independently, combined, and/or stored in memory for one or more separate computing devices that are included in computer infrastructure 102. Further, it is understood that some of the systems and/or functionality may not be implemented, or additional systems and/or functionality may be included as part of environment 100. For example, some of the systems may be implemented as part of CPIT 84.

Figure 3:
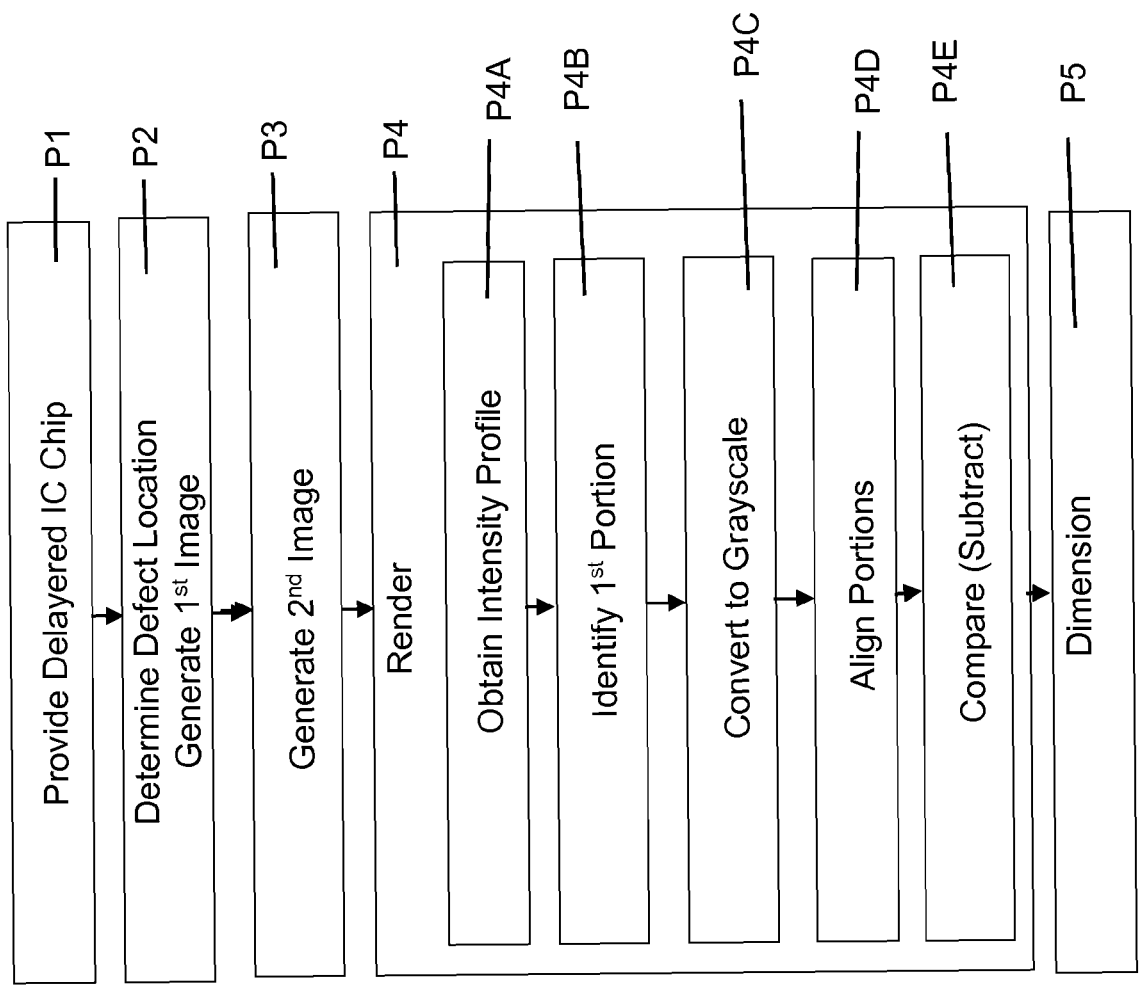
FIG. 3 shows a flow diagram of one embodiment of operational methodology of the evaluation system of FIG. 2.

Turning to FIG. 3 in conjunction with the other figures, one embodiment of an operational methodology of rendering system 106 will now be described. In process P1, IC chip 82 is provided delayered to selected layer 86. As described above, IC chip 82 may be delayered using any now known or later developed technique, e.g., etching, polishing, etc. A surface 89 of structure 88 is exposed through which evaluation of defect 90 will occur. As noted above, defect 90 may be located anywhere below surface 89.

In process P2, defect location determinator 132 determines defect 90 location below surface 89 of selected layer 86 using first image 96, as shown in FIG. 4, of IC chip 82, First image 96 is obtained by image obtainer 130 from (using) CPIT 84 that generates first image 96 in a secondary electron (first) mode. Image obtainer 130 may include any communications system for interfacing with CPIT 84 and may be provided as part of CPIT 84. Defect location determinator 132 may perform any now known or later developed voltage contrast inspection technique that identifies defect 90 by changes in the brightness of structures within first image 96. Two defects 162, 164 are shown in FIG. 4 where the structures change from a brighter element at one potential to a darker element at a different potential. While first image 96 indicates the location of defect 90 (FIG. 1), it does not indicate what the characteristics of the defect such as dimensions, shape, etc., i.e., it does not provide a rendering of the defect.

In process P3, CPIT 84 generates, and image obtainer 130 obtains, a second image 98 (FIG. 5) of IC chip 82 with CPIT 84 in a backscatter (second) mode that uses a higher accelerating voltage than the secondary electron (first) mode. As described above, the second mode may use an accelerating voltage in the range of approximately 15 kV to approximately 30 kV. Second image 98 (FIG. 5) represents, as shown in FIG. 1, charged particle 95 signal from defect 90 below surface 89 of selected layer 86. However, the presence of defect 90 is indiscernible from FIG. 5.

In process P4, renderer 134 renders defect 90 by comparing an image intensity of a reference portion 170 (FIGS. 5-8) of second image 98 not including a defect with the image intensity of a defective portion 172 (FIGS. 5-8) of second image 98 including defect 90. "Rendering" means generating a visual, three-dimensional representation of defect 90, e.g., so characteristics of the defect such as dimensions, shape, etc. can be visualized. Reference portion 170 and defective portion 172 are image segments of structures expected to be substantially identical, e.g., designed to be substantially identical. For example, in structure 88, both portions 170, 172 are images of ends of an M3 wire with a via 92A, 92B there under to an M2 wire. While reference portion 170 and defective portion 172 are shown taken from a single second image 98, they may come from different second images 98 of substantially the same structure, perhaps in another area of IC chip 82. Process P4 may occur in a number of ways.

in one embodiment, in process P4A, an intensity profile 176A, as shown in FIG. 5, of a structure (88 including via 92A) including defect 90 from second image 98 and an intensity profile 176B of a substantially identical structure (88 including via 92B) not including the defect from second image 92 are obtained from CPIT 84. Intensity profile 176A-B may be obtained in any now known or later developed manner, functions for which may be provided by CPIT 84. In the embodiment shown in FIG. 5, CPIT 84 provides (perhaps through rendering system 106) a movable selection line 178 that can be positioned anywhere and at any length over second image 198, e.g., via a graphical user interface of CPIT 84 or rendering system 106. CPIT 84 or rendering system 106 plots pixel intensity versus location along line 178. Selection mechanisms other than a line 178 may also be employed. Although intensity profiles 176A-B are shown as of an integral structure 88 having via 92A including defect 90 and an anticipated substantially identical via 92B not including the defect, the intensity profiles 176A-B need not come from an integral structure 88 so long as the two intensity profiles 176A-B are of structures that are expected to be substantially identical. A sensitivity of the imaging, e.g., processes P2 and P3, and hence intensity profiles can be adjusted or selected by selecting a thickness of selected layer 86. That is, the amount of delayering provided in process P1 can be used to control image intensity.

In process P4B, defect portion identifier 136 identifies reference portion 170 and defective portion 172 of second image 98 from intensity profile(s) 176. As in first image 96, structures that are thicker in second image 98 have a higher pixel intensity (brighter) than those with defects 90, i.e., voids as shown within the example here. It is understood that there may be instances where the reverse contrast to that described may be used. However, in contrast to first image 96, the variation in intensity would be undetectable to the naked eye's review of second image 98 but for intensity profiles 176A, 176B. In the example structure 88, shown in FIG. 1, two vias 92A, 928 are present under metal layer M3. (FIG. 1 shows the segments thereof that constitute reference portion 170 and defective portion 172 with phantom circles.) As shown in FIG. 5, intensity profile 176B indicates defective portion 172 (right side) includes defect 90 (FIG. 1) where the pixel intensity is not as high compared to intensity profile 176A of reference portion 170 (left side). Intensity profiles 176A, 176B of portions 170, 172, respectively, are supposed to be substantially identical since reference portion 170 and defective portion 172 are of structures expected to be substantially identical. A lower intensity indicates less charged particle 95 signal, and hence, less material present at the location of defect 90.

Figure 6:
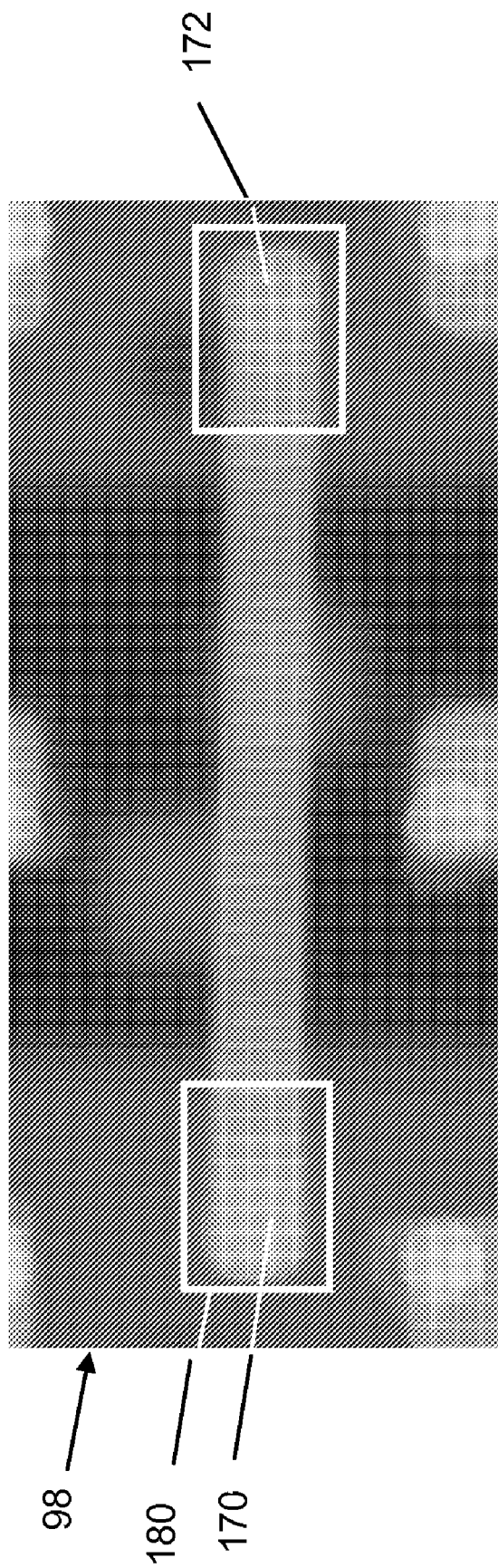
FIG. 6 shows identification of portions of a structure by the evaluation system of FIG. 2, one of the portions including a defect.
Figure 7:
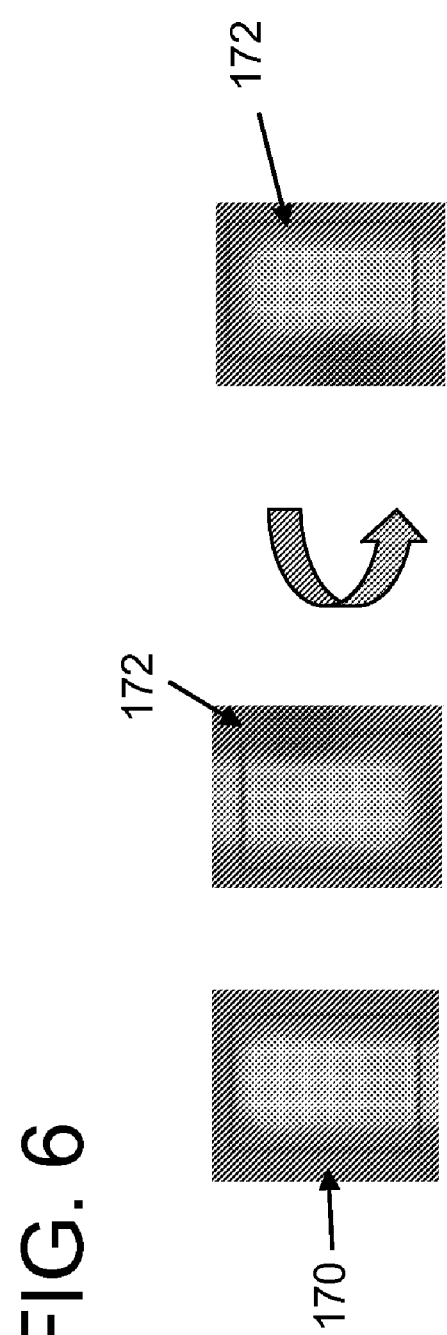
FIG. 7 shows aligning of the portions of FIG. 6.
Figure 8:
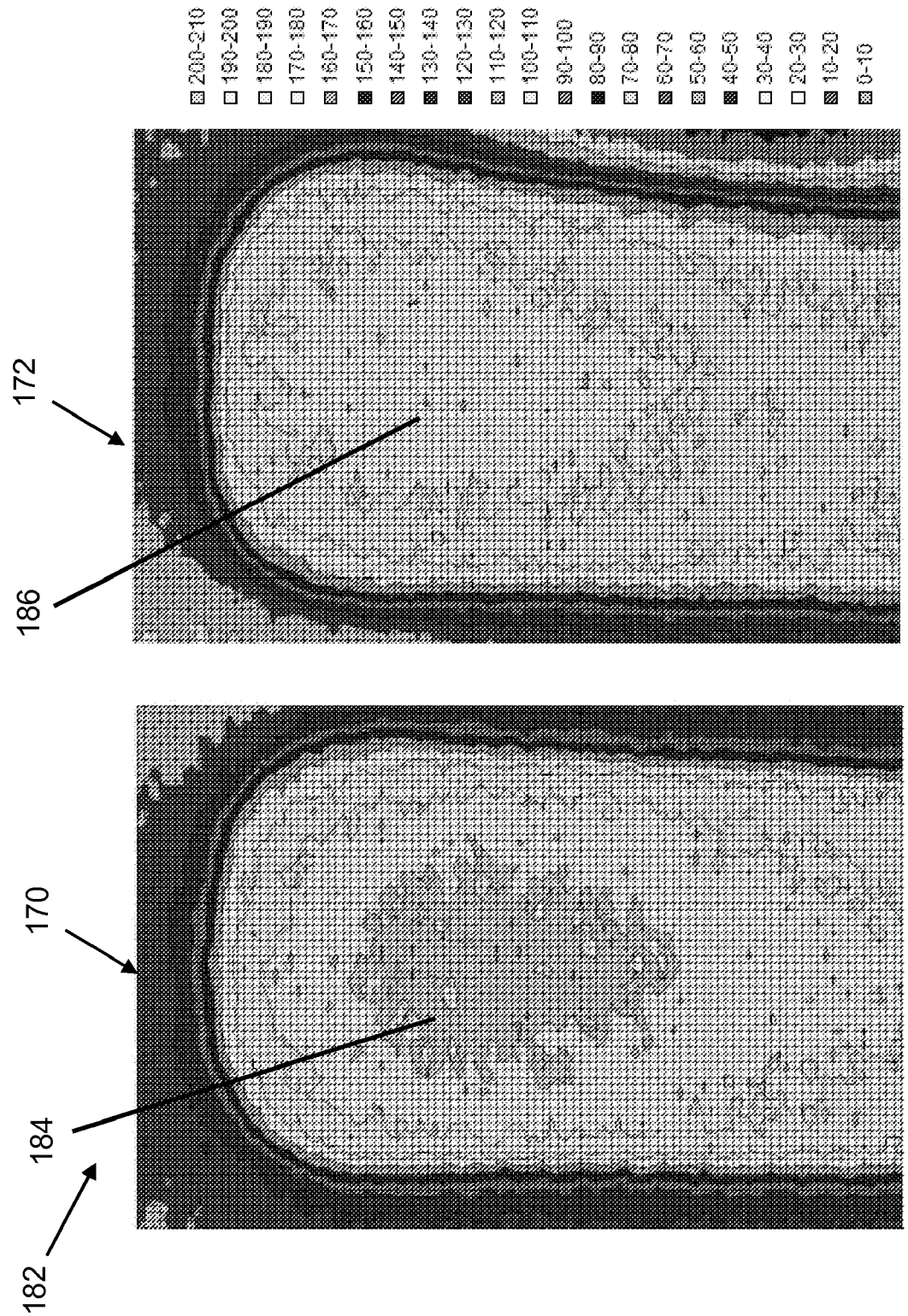
FIG. 8 shows side-by-side illustration of the portions of FIG. 7 after conversion to a grayscale map.

In process P4C, grayscale determinator 138 determines grayscale intensity values of reference portion 170 and defective portion 172, and may, as necessary, convert reference portion 170 and defective portion 172 of second image 98 to a format compatible with data analyzer 139. An image from CPIT 84 includes a series of pixels which represent the number of charged particles received from a specific location of IC chip 82. Each pixel has a grayscale intensity, which may be stated as a grayscale intensity value between, for example, 0 (black) to 255 (white) for each pixel or the relevant pixels in second image 98. Other grayscale level ranges are also possible. Grayscale determinator 138 extracts those values from the image file format of CPIT 84 while maintaining their given array (image location) and may also convert them to a format compatible with data analyzer 139. As shown in FIG. 6, reference portion 170 and defective portions 172 of second image 98 may be selected from second image 98: e.g., using an adjustable selection box 180, for conversion, so long as reference portion 170 and defective portion 172 are of structures expected to be substantially identical. As shown in FIG. 7, reference portion 170 and/or defective portion 172 may be rotated for side-by-side comparison. Data analyzer 139 may include any now known or later developed system capable of viewing, manipulating, mathematically altering, etc., pixel data from an image. In one embodiment, data analyzer 139 includes a spreadsheet program, e.g., Microsoft Excel, or may include a specialized program for performing the processes described herein. As shown in FIG. 8, conversion results in a data analyzer image 182 of pixel intensity versus location (may be colored). After conversion, for the example shown, reference portion 170 has an area 184 therein with a gray level within approximately 200-210, and defective portion 172 has an area 186 therein with a gray level within 190-200, the latter of which indicates the presence of defect 90. Defect 90 is now readily recognized in data analyzer image 182 in FIG. 8. The degree of the gray level in defective portion 172 also indicates the amount of material missing in defect 90, which as will be described herein, can be used to render defect 90.

In process P4D, portion aligner 140 aligns the grayscale intensity values of reference portion 170 with the grayscale intensity values of defective portion 172. Portion analyzer 140 may be a component of data analyzer 139, e.g., a spreadsheet program, or a graphics editor, e.g., Adobe Photoshop, capable of image manipulation. However, other specialized components may be employed to ensure reference portion 170 and defective portion 172 are aligned as much as possible. In any case, this process performs a best fit overlay of reference portion 170 and defective portion 172.

Figure 9:
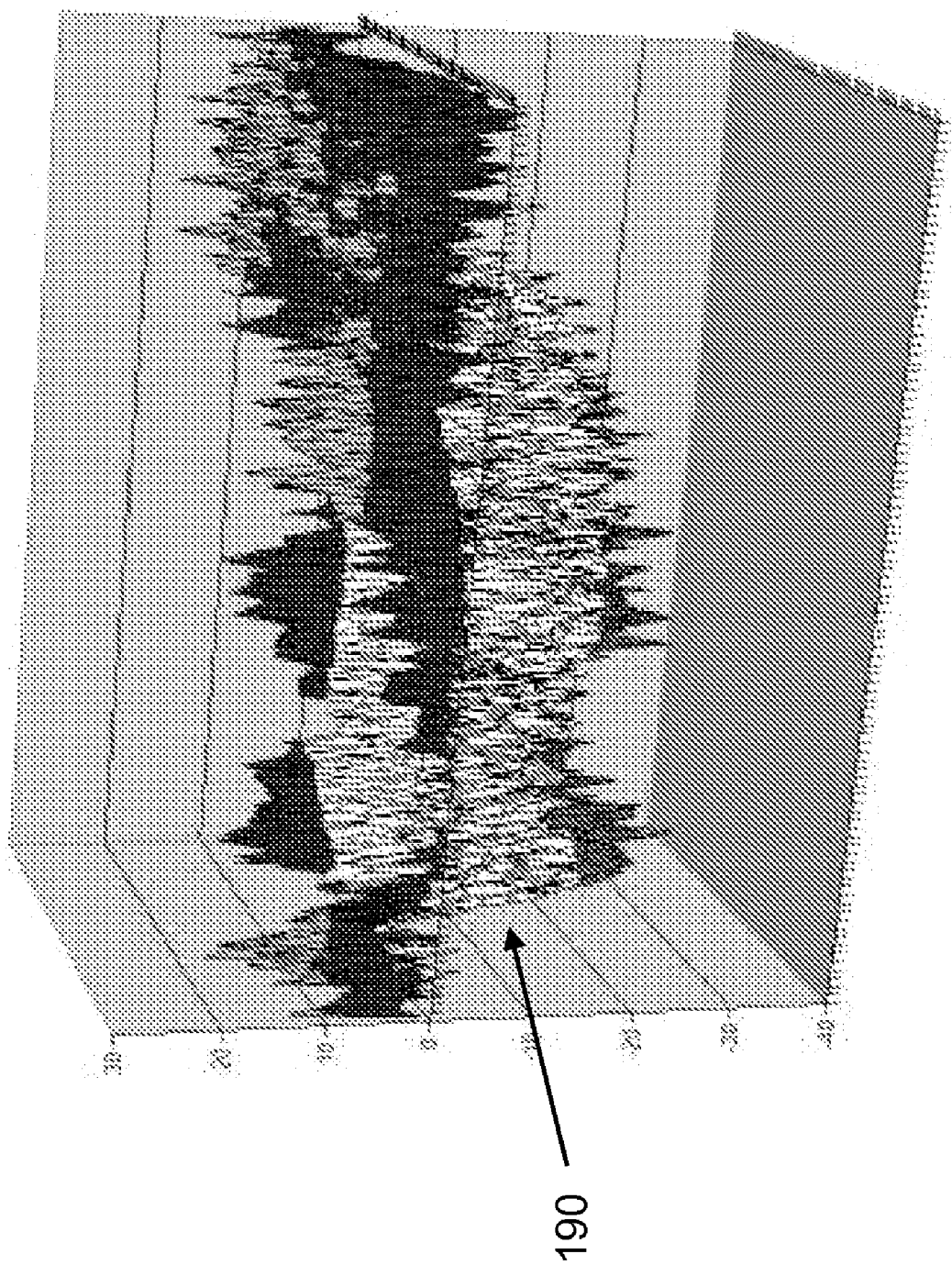
FIG. 9 shows rendering of the defect using the evaluation system of FIG. 2.
Figure 10:
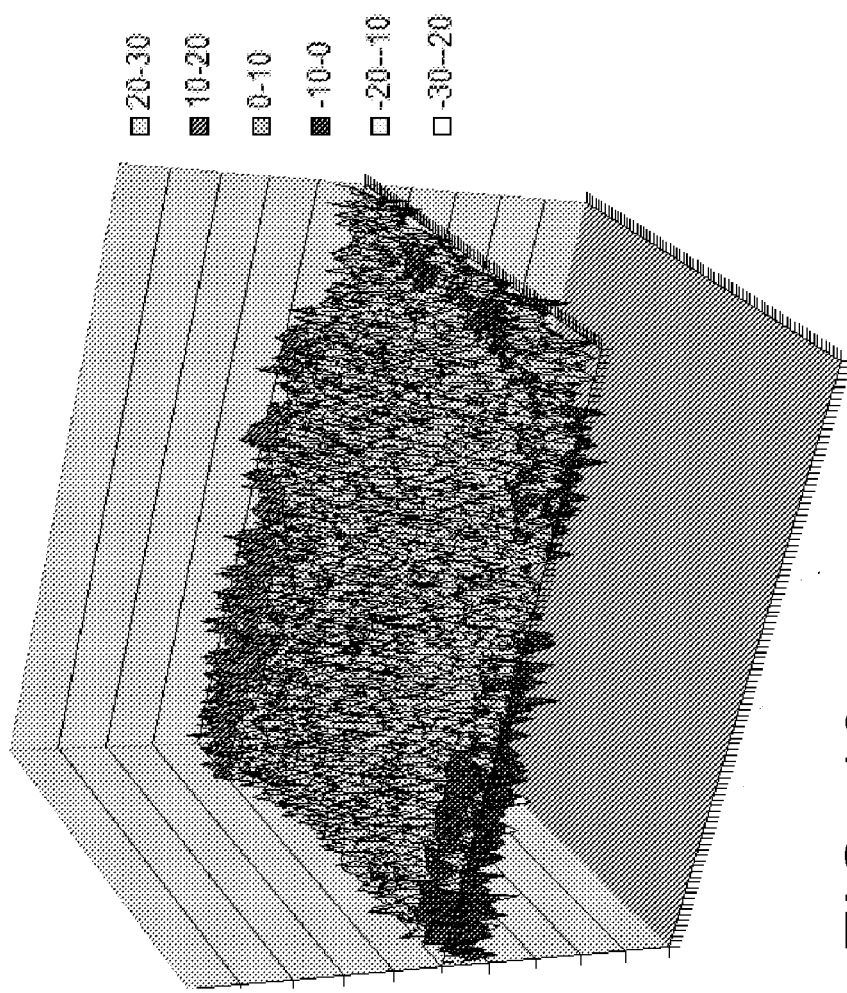
FIG. 10 shows rendering of a non-defective structure using the evaluation system of FIG. 2 for comparison with FIG. 9.

In process P4E, differentiator 142 differences the grayscale intensity values of reference portion 170 from the grayscale intensity values of defective portion 172 to obtain, as shown in FIG. 9, a three-dimensional (3D) representation 190 (i.e., where graph dips to −20) of defect 90 below surface 89 of selected layer 86. The differences in intensity between reference portion 170 and defective portion 172 are typically on the order of 10-30 grayscale levels depending on the size of defect 90, e.g., void thickness. However, the disclosure is not limited to that variation since the intensity sensitivity can be controlled by the thickness of selected layer 86. Differentiator 142 may be provided as part of data analyzer 139 or as a separate component. For contrast purposes, FIG. 10 shows the same comparison of two healthy, defect-free portions (like reference portion 170), which results in an average and substantially uniform grayscale value difference of less than 10 grayscale levels. Ideally, there should be no difference; however, this is nearly impossible to due manufacturing processes.

Figure 11:
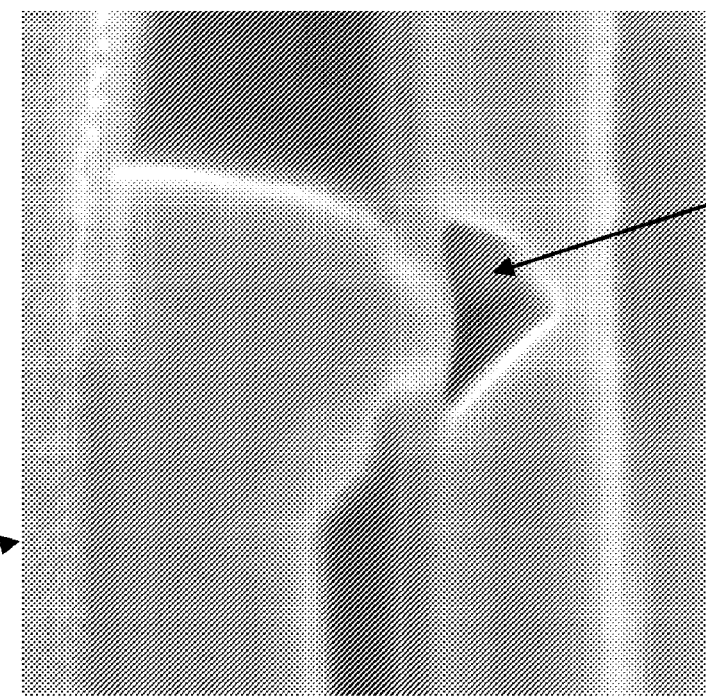
FIG. 11 shows a cross-section of a defect.

In process P5, dimensioner 148 may use 3D representation 190 to obtain an actual defect 90 dimension and shape. Process P5 may occur in a number of ways. In one embodiment, IC chip 82 may be cross-sectioned using, for example, a dual focused ion beam (FIB) 198 (FIG. 1). An actual defect 90 dimension and shape can be obtained using an image 200, as shown in FIG. 11 of the cross-section in a known fashion, e.g., matching a length adjustable pointer to the image. In another embodiment, a calibration of 3D representation 190 values to dimensions of defects 90 may be determined, e.g., using empirical data, and dimensions and a shape of defect 90 drawn directly from 3D representation 190. Furthermore, calibrations of grayscale intensity to defect size may also be generated using dimensioner 148. For example, in one IC chip 82 design, about 17 nm of void thickness was represented by a loss of about 1 level of grayscale intensity. Again, the disclosure is not limited to those values since the sensitivity, as described above, can be changed by the amount of delayering of selected layer 86 is provided in process P1.

As discussed herein, various systems and components are described as "obtaining" data (e.g., image obtainer 130, etc.). It is understood that the corresponding data can be obtained using any solution. For example, the corresponding system/component can generate and/or be used to generate the data, retrieve the data from one or more data stores (e.g., a database), receive the data from another system/component, and/or the like When the data is not generated by the particular system/component, it is understood that another system/component can be implemented apart from the system/component shown, which generates the data and provides it to the system/component and/or stores the data for access by the system/component.

While shown and described herein as a method and system for non-destructive, below-surface defect rendering of IC chip 82 using image intensity analysis, it is understood that the disclosure further provides various alternative embodiments. That is, the disclosure can take the form of an entirely hardware embodiment, an entirely software embodiment or an embodiment containing both hardware and software elements. In a preferred embodiment, the disclosure is implemented in software, which includes but is not limited to firmware, resident software, microcode, etc. In one embodiment, the disclosure can take the form of a computer program product accessible from a computer-usable or computer-readable medium providing program code for use by or in connection with a computer or any instruction execution system, which when executed, enables a computer infrastructure to perform non-destructive, below-surface defect rendering of IC chip 82 using image intensity analysis. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, such as storage system 122, magnetic tape, a removable computer diskette, a random access memory (RAM), a read-only memory (ROM), a tape, a rigid magnetic disk and an optical disk. Current examples of optical disks include compact disk—read only memory (COD-ROM), compact disk—read/write (CD-R/W) and DVD.

A data processing system suitable for storing and/or executing program code will include at least one processing unit 114 coupled directly or indirectly to memory elements through a system bus 118. The memory elements can include local memory, e.g., memory 112, employed during actual execution of the program code, bulk storage (e.g., memory system 122), and cache memories which provide temporary storage of at least some program code in order to reduce the number of times code must be retrieved from bulk storage during execution In another embodiment, the disclosure provides a method of generating a system for performing non-destructive, below-surface defect rendering of IC chip 82 using image intensity analysis. In this case, a computer infrastructure, such as computer infrastructure 102 (FIG. 2), can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing device 104 (FIG. 2), from a computer-readable medium; (2) adding one or more computing devices to the computer infrastructure; and (3) incorporating and/or modifying one or more existing systems of the computer infrastructure, to enable the computer infrastructure to perform the process steps of the disclosure.

In still another embodiment, the disclosure provides a business method that performs the process described herein on a subscription, advertising, and/or fee basis. That is, a service provider, such as an application service provider, could offer to perform non-destructive, below-surface defect rendering of IC chip 82 using image intensity analysis as described herein. In this case, the service provider can manage (e.g., create, maintain, support, etc.) a computer infrastructure, such as computer infrastructure 102 (FIG. 2), that performs the process described herein for one or more customers. In return, the service provider can receive payment from the customer(s) under a subscription and/or fee agreement, receive payment from the sale of advertising to one or more third parties, and/or the like.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language code or notation, (b) reproduction in a different material form; and/or (c) decompression. To this extent program code can be embodied as one or more types of program products, such as an application/software program, component software/a library of functions, an operating system, a basic I/O system/driver for a particular computing and/or I/O device, and the like.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method comprising:
providing an integrated circuit (IC) chip delayered to a selected layer;
determining a defect location below a surface of the selected layer using a first image of the IC chip generated using a charged particle imaging tool (CPIT) in a first mode;
generating a second image of the IC chip with the CPIT in a second mode, the second image representing charged particle signal from the defect below the surface of the selected layer;
rendering the defect by comparing an image intensity of a reference portion of the second image not including the defect with the image intensity of a defective portion of the second image including the defect, wherein the reference portion and the defective portion are of structures expected to be substantially identical.

2. The method of claim 1, wherein the first mode includes a secondary electron mode of the CPIT, and the second mode includes a backscatter mode of the CPIT.

3. The method of claim 1, wherein the backscatter mode employs an accelerating voltage between approximately 15 kV and approximately 30 kV.

4. The method of claim 1, wherein the rendering includes:
obtaining an intensity profile of a structure including the defect from the second image and an intensity profile of a substantially identical structure not including the defect from the second image;
identifying the reference portion and the defective portion of the second image from the intensity profiles;
determining grayscale intensity values of the reference portion and the defective portion;
aligning the reference portion with the defective portion; and
differencing the grayscale intensity values of the reference portion from the grayscale intensity values of the defective portion to obtain a three-dimensional representation of the defect below the surface of the selected layer.

5. The method of claim 1, further comprising:
cross-sectioning the IC chip using a dual focused ion beam (FIB); and
obtaining an actual defect dimension and shape.

6. The method of claim 1, wherein the providing includes selecting a sensitivity of the imaging by selecting a thickness of the selected layer.

7. The method of claim 1, wherein the rendering includes using a spreadsheet program.

8. A system comprising:
means for determining a defect location below a surface of a selected, exposed layer of an integrated circuit (IC) chip using a first image of the IC chip obtained using a charged particle imaging tool (CPIT) in a first mode;
means for generating a second image of the IC chip with the CPIT in a second modes the second image representing charged particle signal from the defect below the surface of the selected layer; and
means for rendering the defect by comparing an image intensity of a reference portion of the second image not including the defect with the image intensity of a defective portion of the second image including the defect, wherein the reference portion and the defective portion are of structures expected to be substantially identical.

9. The system of claim 8, wherein the first mode includes a secondary electron mode of the CPIT and the second mode includes a backscatter mode of the CPIT.

10. The system of claim 8, wherein the second mode employs an accelerating voltage between approximately 15 kV and approximately 30 kV.

11. The system of claim 8, wherein the rendering means includes:
    means for obtaining an intensity profile of a structure including the defect from the second image and an intensity profile of a substantially identical structure not including the defect from the second image;
    means for identifying the reference portion and the defective portion of the second image from the intensity profiles;
    means for determining grayscale intensity values of the reference portion and the defective portion;
    means for aligning the reference portion with the defective portion; and
    means for differencing the grayscale intensity values of the reference portion from the grayscale intensity values of the defective portion to obtain a three-dimensional representation of the defect below the surface of the selected layer.

12. The system of claim 8, further comprising:
    means for cross-sectioning the IC chip using a dual focused ion beam (FIB); and
    means for obtaining an actual defect dimension and shape.

13. The system of claim 8, wherein a sensitivity of the imaging is determined by a thickness of the selected layer.

14. The system of claim 8, wherein the rendering means includes a spreadsheet program.

15. A program product stored on a computer-readable medium including program code, which when executed by a computer, performs the following processes:
    determining a defect location below a surface of a selected, exposed layer of an integrated circuit (IC) chip using a first image of the IC chip obtained using a charged particle imaging tool (CPIT) in a first mode;
    generating a second image of the IC chip with the CPIT in a second mode using a higher accelerating voltage than the first mode, the second image representing charged particle signal from the defect below the surface of the selected layer; and
    rendering the defect by comparing an image intensity of a reference portion of the second image not including the defect with the image intensity of a defective portion of the second image including the defect, wherein the reference portion and the defective portion are of structures expected to be substantially identical.

16. The program product of claim 15, wherein the first mode includes a secondary electron mode of the CPIT, and the second mode includes a backscatter mode of the CPIT.

17. The program product of claim 15, wherein the rendering includes:
    obtaining an intensity profile of a structure including the defect from the second image and an intensity profile of a substantially identical structure not including the defect from the second image;
    identifying the reference portion and the defective portion of the second image from the intensity profiles;
    determining grayscale intensity values of the reference portion and the defective portion;
    aligning the reference portion with the defective portion; and
    differencing the grayscale intensity values of the reference portion from the grayscale intensity values of the defective portion to obtain a three-dimensional representation of the defect below the surface of the selected layer.

18. The program product of claim 15, further comprising program code for directing performing of:
    cross-sectioning the IC chip using a dual focused ion beam (FIB); and
    obtaining an actual defect dimension and shape.

19. The program product of claim 15, wherein a sensitivity of the imaging is determined by a thickness of the selected layer.

20. The program product of claim 15, wherein the rendering code includes a spreadsheet program.

* * * * *